United States Patent [19]

Hasegawa

[11] Patent Number: 5,140,220
[45] Date of Patent: Aug. 18, 1992

[54] LIGHT DIFFUSION TYPE LIGHT EMITTING DIODE

[75] Inventor: Yasuo Hasegawa, Shiga, Japan

[73] Assignees: Yumi Sakai; Masakatsu Uchiyama, both of Kyoto, Japan

[21] Appl. No.: 240,416

[22] Filed: Sep. 1, 1988

Related U.S. Application Data

[63] Continuation of Ser. No. 936,831, Dec. 2, 1986, abandoned.

[30] Foreign Application Priority Data

Dec. 2, 1985 [JP] Japan ............................ 60-186493[U]

[51] Int. Cl.⁵ .................................................. H01J 5/16
[52] U.S. Cl. ..................................... 313/512; 313/116; 313/499; 362/329; 362/800; 340/815.17
[58] Field of Search ............... 313/110, 116, 499, 500, 313/501, 512; 340/815.01, 815.15, 815.17; 362/297, 327, 329, 800

[56] References Cited

U.S. PATENT DOCUMENTS

| | | | |
|---|---|---|---|
| 2,703,398 | 11/1953 | Harrington et al. | 340/381 |
| 3,653,959 | 4/1972 | Kehr et al. | 357/72 X |
| 3,875,456 | 4/1975 | Kano et al. | 313/501 |
| 3,900,863 | 8/1975 | Kim | 357/17 |
| 4,168,102 | 9/1979 | Chida et al. | 313/512 |
| 4,191,943 | 3/1980 | Cairns et al. | 340/815.01 |
| 4,195,330 | 3/1980 | Savage, Jr. | 362/226 |
| 4,415,604 | 11/1983 | Nativi | 525/455 X |
| 4,521,835 | 6/1985 | Meggs et al. | 362/183 |
| 4,603,496 | 8/1986 | Latz et al. | 313/500 X |

OTHER PUBLICATIONS

Visible Light-Emitting Diode by IBM, Authors Jacobus, Jr. and Stuby, vol. 10, #8, 1968, p. 1120.
Optical Crystals, by Optovac, 1982, pp. 5-1-5-4.

Primary Examiner—Donald J. Yusko
Assistant Examiner—Michael Horabik
Attorney, Agent, or Firm—Price, Gess & Ubell

[57] ABSTRACT

An improved light emitting diode housing member comprises a transparent housing that can extend over the light emitting surface of the LED and can position a plurality of granular optical particles, such as calcium fluoride, over the source of light to provide a diffusion of the emitted light, thereby increasing its viewing angle.

12 Claims, 1 Drawing Sheet

LIGHT DIFFUSION TYPE LIGHT EMITTING DIODE

This is a continuation of application Ser. No. 936,831 filed on Dec. 2, 1986 now abandoned.

BACKGROUND OF INVENTION

1. Technical Field

The present invention relates to improvements in photoelectric transfer devices such as light emitting diode (LED) devices, in which a light emitting semiconductor pellet is monolithically molded in the inner portion thereof, particularly to light diffusion type light emitting diode units having light diffusing means at its light-diffusing end.

2. Prior Art

It is well known that light emitting diodes are photoelectric transfer devices which transmit light energy converted from electrical energy, and are extensively employed as electronic circuit components which operate effectively at lower voltages. The light emitting diode is a device in which a semiconductor pellet is monolithically molded using highly transparent plastic material, with its light emitting end being configured to serve as lens for enhanced directivity of radiated output. However, recent expansion of the semiconductor crystal growth techniques has led to marked improvement in light emission efficiency; and hence, to design said light emitting diode devices so as to allow light to radiate in a wider angle without controlling the light in any specific direction, rather than to cause the light to closely follow a specified direction, results in expanded applications of the present invention, thus making it more advantageous.

OBJECT OF INVENTION

Accordingly, it is the object of the present invention to provide a light diffusion type light emitting diode unit having an exceedingly simple structure in which a light diffusing means is provided at the light radiating end of the light emitting device to form an integral unit, and offering higher efficiency in diffused radiation of light.

SUMMARY OF INVENTION

Specifically, the present invention relates to a light diffusion type light emitting diode comprising, for attaining the foregoing object, a light emitting diode device having the light emitting end capable of controlling the direction of outgoing rays, and a transparent light diffusing member having a light diffusedly-radiated surface at one end, and at the other end a coupling hole which extends from said other end to said surface and has its innermost portion formed as a granular housing; placing, gluing or planting grains in the granular housing in said light diffusing member; and so constructed as to couple the light emitting end of said light emitting diode device to said grains through the coupling hole provided in said light emitting member, so that they face each other.

Figure 1:
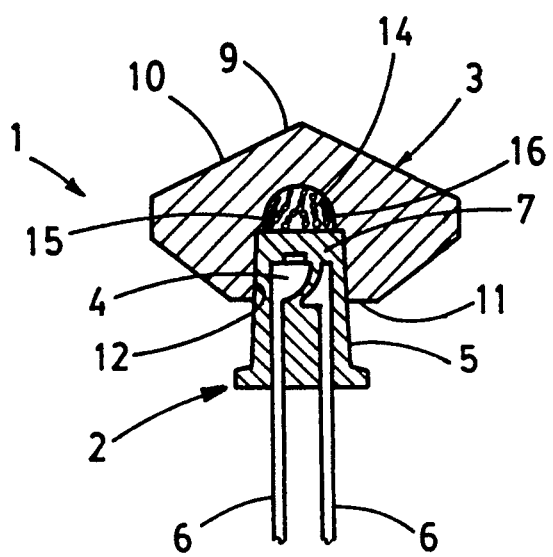
FIG. 1 is a sectional side elevation view of the basic structure of a light diffusion type light emitting diode unit of the present invention.
Figure 2:
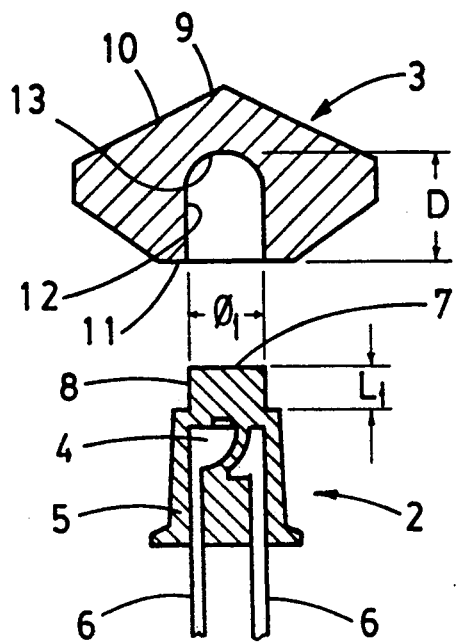
FIG. 2 is an exploded sectional elevation view of another form of the coupled portion between a light emitting diode invention and a light diffusing member.

(1) ... Light diffusion type light emitting diode unit
(2) ... Light emitting diode invention
(3) ... Light diffusing member
(7) ... Light emitting end
(8) ... Connecting portion
(10) ... Light diffusedly-radiated surface
(12) ... Coupling hole
(15) ... Space room
(16) ... Transparent grains

DESCRIPTION OF INVENTION

Figure 3A:
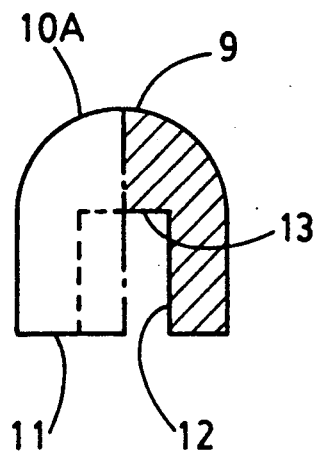
FIGS. 3A and 3B are side views, half in cross section, of different forms of the light diffusing member.
Figure 3B:
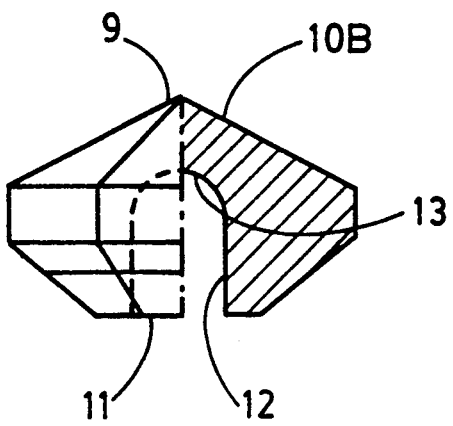

Now the present invention will be described in detail referring to the drawings, and in connection with the following examples:

A light diffusion type light emitting diode unit 1 of the present invention comprises in its essential portion a light emitting diode device 2 and a light diffusing member 3, both being coupled to each other. Said light emitting diode device 2 is fabricated by monolithically molding a semiconductor pellet portion 4 using a highly transparent plastic material 5, such as acrylic resins, and includes a pair of lead portions 6 at one end and a light radiating end 7 at the other end. Said light radiating end 7 in said light emitting device 2 need not have a lens-like configuration for enhanced directivity, but, as seen in the accompanying drawings, may be constructed to form a coupling portion 8 having an outer diameter $\phi_1$ and a length $L_1$, which is to be fitted into the light diffusing member 3 to be described subsequently. On the other hand, said light diffusing member 3 is molded into various configurations with highly transparent plastics such as acrylic composite resins, as typically represented by FIGS. 3A and 3B. In any of the examples cited above, said light diffusing member has a light diffusedly-radiated surface 10 at one end, and a coupling hole 12 at the other end. Said light diffusedly-radiated surface 10 is defined as spherical surface 10A as indicated in FIG. 3A, in one example, and as cut surface 10, in another example, which is diamond-cut into a multifaceted configuration, as depicted in FIG. 3B. Said coupling hole 12 extends from the end of the light diffusing member 3 to said light diffusedly-radiated surface 10 and ends at a bottom wall 13. The depth D of said coupling hole 12 is greater than the length $L_1$ of the coupling portion with said light emitting diode device 2; alternatively, a concave portion 14 of reduced diameter can be provided in the bottom surface 13 of the coupling hole 12 on the side of said light diffusing member 3 so that the depth of insertion into said coupling hole 12 equivalent to the length $L_1$ of the coupling portion of the light emitting diode device 2. In either case, it is acceptable as long as the coupling hole 12 is designed so that a space room 15 is created when the light emitting end coupling portion 8 in said light emitting diode device 2 is fitted into the coupling hole 12 of said light diffusing member. Into said space room 15 there are placed, glued or planted transparent grains 16 for light diffusion before the said coupling hole 12 and the coupling portion of the light emitting diode device 2 are fitted together to form a coupling. Said grains 16 are made of, for example, a single-crystal material of calcium fluoride ($CaF_2$). Preferably, said grains 16 possess high transparency and refractive index, and are of the order of 20 to 30 mesh. Said grains 16 are placed, glued or planted into the space room 15 in said light diffusing member 3. The grains can, for example, be "potted" by adding methylene chloride to allow the wall of said space room 15 composed of acrylic resin to dissolve itself, thereby locking the grains 16.

The light diffusion type light emitting diode unit relating to the present invention and having the above-mentioned construction provides a light diffusing means in the light radiating portion of the light emitting diode, thus making it possible to design a light emitting diode capable of effectively diffusing outgoing radiation, and also of checking for the light emitting diode being properly lit from various angles. Accordingly, the light diffusion type light emitting diode of the present invention is widely applicable and highly effective as accompanying light emitting device for indicator lamps in advertisement devices, signs and other equipment, and also for store decoration and display devices.

Having described our invention as related to the examples shown in the accompanying drawings, it is our intention that the invention be not limited by any of the details of description, unless otherwise specified, but rather be construed broadly within its spirit and scope as set out in the claims.

What is claimed is:

1. An improved light diffusing light emitting diode assembly comprising:
    a light emitting device with a light radiating end capable of controlling the direction of a radiated output of light;
    a transparent hollow housing member mounted on the light emitting device and extending over the light radiating end, and
    a plurality of granular optical particles positioned within the transparent hollow housing member and extending between the light radiating end and the housing member, the granular optical particles having exposed surfaces within the hollow portion of the housing member for reflecting and refracting light from the light radiating end and also having particle surfaces adhering to the housing member to stationarily fix those optical particles, whereby a diffusion of light can be accomplished.

2. The diode assembly of claim 1 wherein the granular particles are formed of calcium fluoride.

3. The diode assembly of claim 1 wherein the granular particles are approximately 20 to 30 mesh in particle size.

4. The diode assembly of claim 1 wherein the granular particles are potted in methylene chloride within the housing member.

5. The diode assembly of claim 1 wherein the housing member has a plurality of planar facets.

6. The diode assembly of claim 4 wherein the granular particles are formed of calcium fluoride and are secured by methylene chloride within the housing member.

7. An improved light diffusing light emitting diode assembly comprising:
    a light emitting base member having a light emitting device mounted in a transparent plastic housing member, the base member including a light radiating end member and a coupling portion extending adjacent to and around the light radiating end member on the plastic housing member;
    a light diffusing member of a hemispherical hollow core configuration is dimensioned to interface with and is fixed to the coupling portion, and
    a plurality of granular optical particles positioned within the hollow core and extending between the light radiating end member and the light diffusing member, the granular optical particles having air exposed surfaces within the hollow core of the diffusing member for reflecting and refracting light projecting from the light radiating end and also having particle surfaces adhering to the housing member to stationarily fix the optical particles.

8. The diode assembly of claim 7 wherein the granular particles are calcium fluoride.

9. The diode assembly of claim 7 wherein the granular particles are approximately 20 to 30 mesh in particle size.

10. The diode assembly of claim 7 wherein an exterior envelope of the diffusing member has a multifaceted configuration.

11. An improved light diffusing light emitting diode assembly consisting of:
    a single light emitting device with a transparent light radiating end positioned above the light emitting device and capable of controlling the direction of a radiated output of light;
    a coupling portion integrally positioned on the light radiating end;
    a transparent hollow housing member mounted on the coupling portion of the light emitting device and extending over the light radiating end, an exterior surface of the housing member has a multifaceted configuration, and
    a plurality of granular optical particles of approximately 20 to 30 mesh in particles size are positioned within the transparent hollow housing member and extend between the light radiating end and the housing member, the granular optical particles having air exposed surfaces within the hollow portion of the housing member for reflecting and refracting light from the light radiating end and some, but not all of the particles also having a portion of their particle surfaces adhering to the housing member to stationarily fix those optical particles, whereby a diffusion of light can be accomplished.

12. The diode assembly of claim 11 wherein the granular particles are embedded into an interior surface of the hollow housing member.

* * * * *